(12) United States Patent
Baek (10) Patent No.: US 11,329,068 B2
(45) Date of Patent: May 10, 2022

(54) DISPLAY DEVICE

(71) Applicant: SAMSUNG DISPLAY CO., LTD., Yongin-si (KR)

(72) Inventor: Seungho Baek, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 31 days.

(21) Appl. No.: 16/193,001

(22) Filed: Nov. 16, 2018

(65) Prior Publication Data

US 2019/0206898 A1  Jul. 4, 2019

(30) Foreign Application Priority Data

Dec. 29, 2017  (KR) .......................... 10-2017-0183275

(51) Int. Cl.
*H01L 27/12* (2006.01)
*G06F 3/041* (2006.01)
*G06F 3/045* (2006.01)
*G06F 3/044* (2006.01)

(52) U.S. Cl.
CPC .......... *H01L 27/124* (2013.01); *G06F 3/0412* (2013.01); *G06F 3/0416* (2013.01); *G06F 3/04164* (2019.05); *G06F 3/044* (2013.01); *G06F 3/045* (2013.01)

(58) Field of Classification Search
CPC ............................ G06F 3/04164; G06F 3/0416
See application file for complete search history.

(56) References Cited

U.S. PATENT DOCUMENTS

| 9,123,593 | B2 | 9/2015 | Kang et al. | |
| 9,366,929 | B2 | 6/2016 | Kang et al. | |
| 9,632,381 | B2 | 4/2017 | Kang et al. | |
| 2014/0042406 | A1 | 2/2014 | Degner et al. | |
| 2014/0085585 | A1 | 3/2014 | Sung et al. | |
| 2016/0093685 | A1* | 3/2016 | Kwon | G06F 1/1652 257/40 |
| 2017/0207276 | A1* | 7/2017 | Miyamoto | H01L 27/3211 |
| 2018/0164913 | A1* | 6/2018 | Choi | G06F 3/0416 |

FOREIGN PATENT DOCUMENTS

| KR | 1020130078143 | 7/2013 |
| KR | 10-2014-0038823 | 3/2014 |
| KR | 10-2014-0136233 | 11/2014 |
| KR | 10-2014-0136237 | 11/2014 |
| KR | 10-2014-0136238 | 11/2014 |
| KR | 10-2017-0034040 | 3/2017 |

* cited by examiner

*Primary Examiner* — Priyank J Shah
(74) *Attorney, Agent, or Firm* — F. Chau & Associates, LLC (57) ABSTRACT

A display device includes a display substrate that has a bent portion, a driving chip, and a first connection pad that connects the display substrate and the driving chip disposed on one side surface of the display substrate and that includes an upper pad area and a lower pad area. The display device connects substrates without exposing wirings by attaching the connection pad on the side surface of the display device.

20 Claims, 6 Drawing Sheets

DISPLAY DEVICE

CROSS-REFERENCE TO RELATED APPLICATION

This application claims priority under 35 U.S.C. § 119 from, and the benefit of, Korean Patent Application No. 10-2017-0183275, filed on Dec. 29, 2017 in the Korean Intellectual Property Office (KIPO), the contents of which are herein incorporated by reference in their entirety.

BACKGROUND

1. Technical Field

Embodiments of the present disclosure are directed to a display device, and more particularly, to a display device in which a connection pad is attached to a side surface of the display device to connect substrates without exposing wirings

2. Discussion of the Related Art

Display devices may be classified into liquid crystal display ("LCD") devices, organic light emitting diode ("OLED") display devices, plasma display panel ("PDP") devices, electrophoretic display devices, etc., based on a light emitting scheme thereof. A display device includes a display area and a non-display area in which an image is not displayed. In such a non-display area are disposed wirings that are connected to a driving substrate for the display area, which is located therebelow. However, the wirings may be curved or bent to be connected to the lower display substrate, which can damage the wirings and affect the display image quality.

SUMMARY

Embodiments of the present disclosure are directed to a display device in which a connection pad is attached to a side surface of the display device to substantially prevent damages to wirings.

According to an embodiment, a display device includes: a display substrate that includes a bent portion; a driving chip; and a first connection pad disposed on one side surface of the display substrate that connects the display substrate and the driving chip and that includes an upper pad area and a lower pad area The upper pad area of the first connection pad may be connected to the display substrate, and the lower pad area of the first connection pad may be connected to the driving chip.

The display device may further include a printed circuit board connected to the driving chip.

The first connection pad may include silver.

The first connection pad may be disposed on another side surface of the display substrate.

The display device may further include: a touch layer disposed on the display substrate; and a second connection pad disposed on one side surface of the display substrate and that includes an upper pad area and a lower pad area, where the upper pad area of the second connection pad is connected to the touch layer, and the lower pad area of the second connection pad is connected to the display substrate.

The display device may further include a touch layer driving unit connected to the display substrate by the lower pad area of the second connection pad.

The first connection pad may overlap the second connection pad.

According to an embodiment, a display device includes: a display substrate that includes a bent portion; a touch layer disposed on the display substrate; a first connection pad disposed on at least one side surface of the display substrate and that includes an upper pad area and a lower pad area, where the upper pad area of the first connection pad is connected to the touch layer, and the lower pad area of the first connection pad is connected to the display substrate; and a touch layer driving unit connected to the display substrate.

The first connection pad may be include silver.

The upper pad area of the first connection pad may be connected to the display substrate and the lower pad area of the first connection pad is connected to the touch layer driving unit.

The display device may further include a printed circuit board connected to the touch layer driving chip.

The first connection pad may be disposed on another side surface of the display substrate.

The touch layer driving unit may be connected to the display substrate by the lower pad area of the first connection pad.

According to an embodiment, a display device includes: a display substrate that includes a bent portion; a touch layer disposed on an upper portion of the display substrate; a touch layer driving unit on a lower portion of the display substrate; and a first connection pad disposed on at least one side surface of the display substrate and that includes an upper pad area and a lower pad area, wherein the upper pad area is connected to the touch layer, and the lower pad area is connected to the touch layer driving unit.

The first connection pad may be include silver.

The first connection pad may be disposed on another side surface of the display substrate.

The display device may further include a second connection pad disposed on one side surface of the display substrate and that includes an upper pad area and a lower pad area, where the upper pad area is connected to the touch layer, and the lower pad area is connected to the display substrate.

According to an embodiment, a display device includes: a display substrate that includes a bent portion; and a first connection pad disposed on a side surface of the display substrate and that includes an upper pad area and a lower pad area. The upper pad area includes a terminal that includes a first layer and a second layer, and the terminal transmits signals received from a touch layer.

The first connection pad may be disposed on another side surface of the display substrate.

According to embodiments of the present disclosure, a display device can prevent detachment defects of a circuit board.

The foregoing is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Exemplary embodiments will now be described more fully hereinafter with reference to the accompanying drawings. Although the disclosure may be modified in various manners and have several exemplary embodiments, exemplary embodiments are illustrated in the accompanying drawings and will be mainly described in the specification. However, the scope of the disclosure is not limited to the exemplary embodiments and should be construed as including all the changes, equivalents and substitutions included in the spirit and scope of the disclosure.

In the drawings, thicknesses of a plurality of layers and areas may be enlarged for clarity and ease of description thereof. When a layer, area, or plate is referred to as being "on" another layer, area, or plate, it may be directly on the other layer, area, or plate, or intervening layers, areas, or plates may be present therebetween.

Throughout the specification, when an element is referred to as being "connected" to another element, the element is "directly connected" to the other element, or "electrically connected" to the other element with one or more intervening elements interposed therebetween.

"About" or "approximately" as used herein is inclusive of the stated value and means within an acceptable range of deviation for the particular value as determined by one of ordinary skill in the art, considering the measurement in question and the error associated with measurement of the particular quantity, i.e., the limitations of the measurement system.

Hereinafter, a display device according to an exemplary embodiment will be described in detail with reference to FIGS. 1 through 6. Hereinafter, a display device will be described with respect to an organic light emitting diode ("OLED") display device for ease of description.

Figure 1:
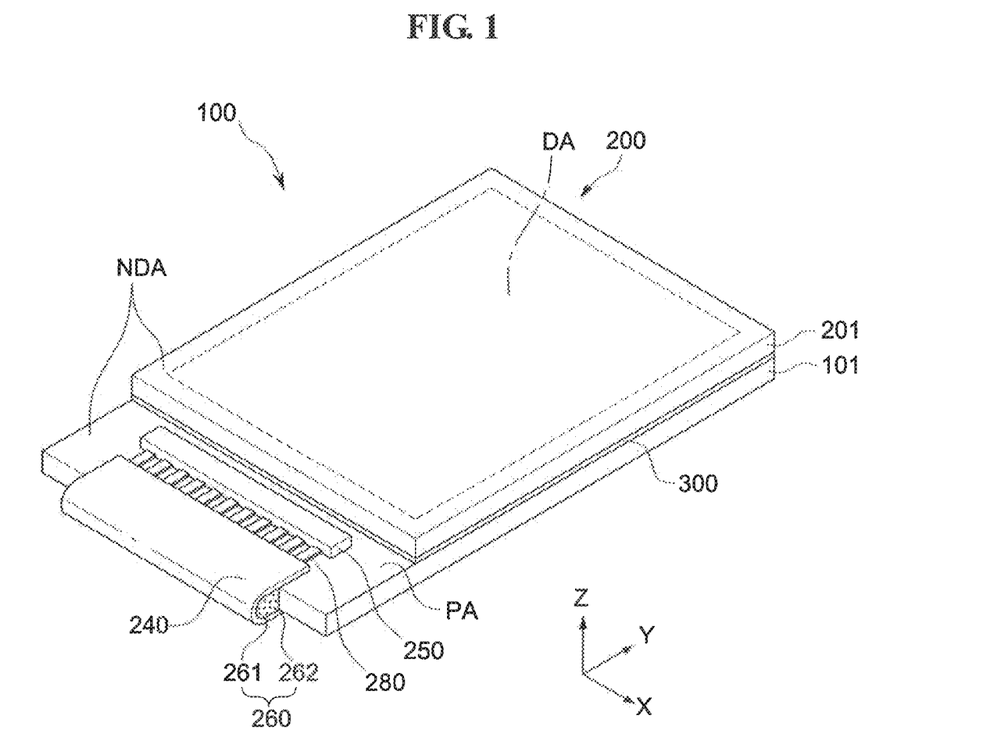
FIG. 1 is a plan view of an organic light emitting diode ("OLED") display device according to an embodiment of the present disclosure.
Figure 2:
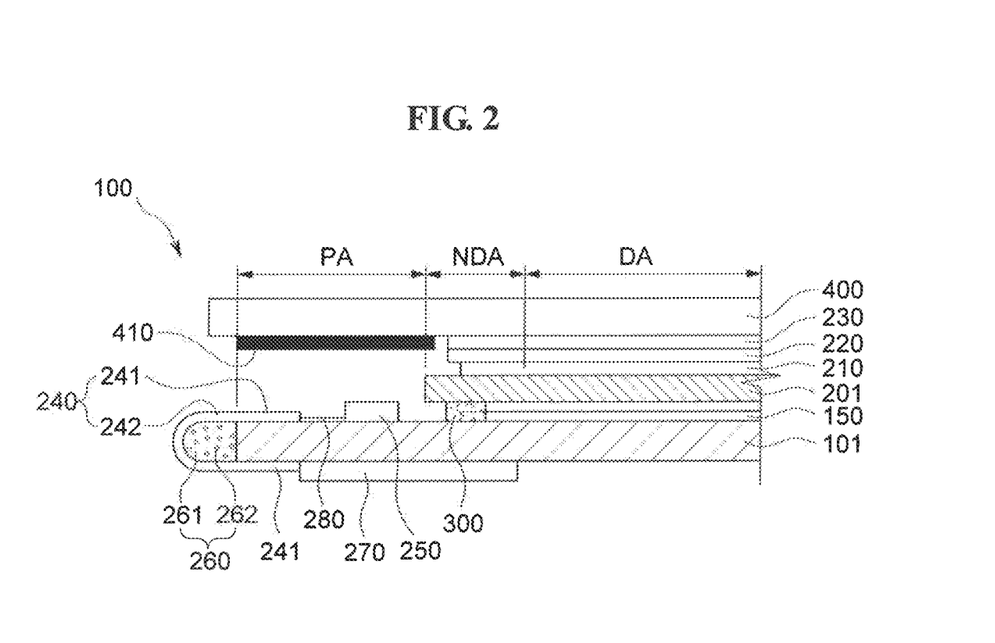
FIG. 2 is a cross-sectional view of an OLED display device of FIG. 1.

FIG. 1 is a plan view of an organic light emitting diode ("OLED") display device 100, and FIG. 2 is a cross-sectional view of the OLED display device 100.

Referring to FIGS. 1 and 2, according to an embodiment, the OLED display device 100 includes a display panel 200, a connection unit 240, a printed circuit board 270, a driving chip 250, a window 400, and a black matrix 410.

According to an embodiment, the display panel 200 is for displaying images, and may be one of a liquid crystal display ("LCD") panel, an electrophoretic display panel ("EDP"), an OLED display panel, a light emitting diode ("LED") display panel, an inorganic electro luminescent ("EL") display panel, a field emission display ("FED") panel, a surface conduction electron-emitter display ("SED") panel, a plasma display panel ("PDP"), or a cathode ray tube ("CRT") panel. However, these are merely illustrated as examples and any kind of display panels that are currently developed and commercialized or to be realized with future technology may be incorporated into the display panel 200 according to a present disclosure.

According to an embodiment, the display panel 200 includes a first substrate 101, a second substrate 201 that opposes the first substrate 101, a display unit 150, a sealing member 300, a touch unit 210, and a polarizer 220. The first substrate 101 includes a display area DA that displays images by emitting light, and a non-display area NDA located outside the display area DA. A plurality of pixels are formed in the display area DA of the first substrate 101 to display images. The display unit 150 is disposed in the display area DA.

According to an embodiment, the non-display area NDA includes a pad area PA in which a plurality of pad electrodes 280 are formed and that receive external signals and transmit the signals to the OED to control light emission. At least one driving chip 250 is formed on the pad area PA.

According to an embodiment, the first substrate 101 includes a transparent glass material that includes, for example, silicon oxide ($SiO_2$) as a main component. However, exemplary embodiments are not limited thereto, and the first substrate 101 may include a transparent plastic material.

According to an embodiment, the driving chip 250 includes a scan driver and a data driver for driving the pixels. In addition, the first substrate 101 further includes pad electrodes disposed in the pad area PA. The driving chip 250 is mounted in the pad area PA of the first substrate 101 as a chip on glass (COG) and is electrically connected to the pad electrodes 280. The driving chip 250 generates scan signals and data signals in response to driving power and signals received from the printed circuit board 270. The scan signals and the data signals are transmitted to gate lines and data lines of the display area DA through the pad electrodes 280.

In an embodiment, the driving chip 250 is not formed in the non-display area NDA and may be omitted. In addition, the driving chip 250 may be mounted on a flexible printed circuit board as a chip on film ("COF"). That is, a tape carrier package ("TCP") scheme in which the driving chip 250 is mounted on the film in the form of a chip can be incorporated into the OLED display device 100.

According to an embodiment, a pad that protects the driving chip 250 against external impacts is further disposed in the pad area PA. The driving chip 250 is an integrated circuit ("IC") chip such as a driving IC.

According to an embodiment, the display unit 150 is formed on the first substrate 101, and is connected to the driving chip 250. The display unit 150 includes an OLED, and a thin film transistor and wirings that drive the OLED. Those elements other than the OLED that serve the function of the display device are considered part of the display unit 150.

According to an embodiment, the second substrate 201 is disposed opposite from the first substrate 101, and is attached to the first substrate 101 by the sealing member 300. The second substrate 201 may include a glass substrate, or may include a transparent synthetic resin film, such as an acrylic film. Further, the second substrate 201 includes a metal plate. For example, the second substrate 201 includes one of a polyethylene (PET) film, a polypropylene (PP) film, a polyamide (PA) film, a polyacetal (POM) film, a poly methyl methacrylate (PMMA) film, a polybutylene terephthalate (PBT) film, a polycarbonate (PC) film, a cellulose film, or a moisture-resistant cellophane.

According to an embodiment, the second substrate 201 has a planar area less than a planar area of the first substrate 101. Accordingly, the pad area PA of the first substrate 101 is exposed by the second substrate 201.

According to an embodiment, the sealing member 300 includes a commonly used material, such as a sealing glass frit.

According to an embodiment, the touch unit 210 is disposed on the second substrate 201 in an area that corresponds to the display area DA of the first substrate 101. The touch unit 210 includes first and second electrodes that cross each other. The first and second electrodes each have a plurality of columns that together form a matrix and are directly patterned on the second substrate 201 as an on-cell type. The first and second electrodes correspond to a touch sensor pattern. In addition, the touch unit 210 may be disposed on the second substrate 201 as a separately manufactured touch panel.

According to an embodiment, the touch unit 210 can detect a touch input by a touch means, such as a pen or a user's finger, and transmits a signal that corresponds to a touched location to a touch driving unit. The touch unit 210 is used as an input means for the OLED display device 100 and may be a resistive type or a capacitive type.

According to an embodiment, the window 400 includes a transparent material, such as glass or a resin. The window 400 protects the display panel 200 from being broken by external impacts. For example, the window 400 is disposed on the touch unit 210 and covers the display area DA and the pad area PA. The window 400 is attached to the second substrate 201 by an adhesive layer 230. The window 400 is larger in size than the display panel 200. However, exemplary embodiments are not limited thereto, and the window 400 may be substantially the same size as the display panel 200.

According to an embodiment, the black matrix 410 is disposed in an area of the window 400 that corresponds to the pad area PA. The black matrix 410 includes a printing material that substantially prevents a pattern below the window 400 from being visible. The printing material includes a black printing material, but the color of the printing material may vary depending on the design of a device to be realized. In an embodiment, the black matrix 410 includes a light absorbing material such as chromium (Cr).

According to an embodiment, the polarizer 220 is disposed between the window 400 and the touch unit 210. The polarizer 220 substantially prevents reflection of external light.

According to an embodiment, the adhesive layer 230 is disposed between the window 400 and the touch unit 210, and improves the luminance, transmittance, reflectance, and visibility of the OLED display device 100. The adhesive layer 230 substantially prevents formation of an air gap between the window 400 and the second substrate 201, and substantially prevents penetration of foreign substances, such as dust. The adhesive layer 230 is a resin. The resin is a photo-curable resin.

According to an embodiment, the printed circuit board 270 transmits driving signals to the display panel 200. The printed circuit board 270 includes, inter alia, a timing controller that generates control signals that drive the display panel 200 and a power voltage generator that generates a power voltage.

According to an embodiment, the printed circuit board 270 is disposed on one surface of the display panel 200. More specifically, the printed circuit board 270 is disposed on a back surface of the display panel 200. In general, the display panel 200 displays images on an upper surface of the display panel 200, and the back surface of the display panel 200 is unseen by a user. Accordingly, the printed circuit board 270 can be disposed on the back surface of the display panel 200 to maximize space efficiency and to hide a configuration that a user does not need to see. However, exemplary embodiments are not limited thereto, and the printed circuit board 270 may be disposed on a side surface of the display panel 200, or the printed circuit board and the flexible printed circuit board may be formed into a unitary structure.

According to an embodiment, since the printed circuit board 270 transmits driving signals to the display panel 200, the printed circuit board 270 is electrically connected to the display panel 200. Accordingly, the connection unit 240 electrically connects the display panel 200 and the printed circuit board 270.

According to an embodiment, the connection unit 240 is connected to the pad area PA of the display panel 200. The connection unit 240 provides an electrical connection between the display panel 200 and the printed circuit board 270. The connection unit 240 is a flexible printed circuit board ("FPCB"). In addition, the connection unit 240 may be a tape carrier package or a chip on film that includes an integrated circuit ("IC") chip.

According to an embodiment, the connection unit 240 includes an overlap portion 241 that contacts the pad area PA of the display panel 200, and a curved surface portion 242 that is curved along the side surface of the display panel 200. For example, as illustrated in FIG. 2, the connection unit 240 includes the overlap portion 241 that contacts the pad area PA of the first substrate 101, and the curved surface portion 242 that is curved along the side surface of the first substrate 101.

According to an embodiment, one end portion of the connection unit 240 is electrically connected to the display panel 200, and another end portion of the connection unit 240 is electrically connected to the printed circuit board 270. Accordingly, the display panel 200 and the printed circuit board 270 are electrically connected to each other by the connection unit 240.

In addition, according to an embodiment, the connection unit 240 includes a base film and a wiring pattern on the base film, and further includes a cover film on the wiring pattern.

According to an embodiment, the wiring pattern is disposed between the base film and the cover film. The wiring pattern transmits electrical signals and includes a metal such as copper (Cu). In addition, tin, silver, nickel, etc., may be plated on the copper surface. Wiring patterns may be formed through various methods, such as casting, laminating, electroplating, etc.

As described above, according to an embodiment, one end portion of the connection unit 240 is electrically connected to the display panel 200, and another end portion of the connection unit 240 is electrically connected to the printed circuit board 270. The one end portion and the other end portion of the connection unit 240 correspond to the overlap portion 241. In addition, the curved surface portion 242 is formed along the side surface of the display panel 200 between the one end portion and the other end portion of the connection unit 240. The curved surface portion 242 surrounds the side surface of the display panel 200.

According to an embodiment, as the OLED display device 100 becomes slimmer, the radius of curvature of the curved surface portion 242 becomes smaller, which increases stress, and a phenomenon in which the overlap portion 241 of the connection unit 240 detaches from the display panel 200 can occur.

Accordingly, according to an embodiment, the OLED display device 100 includes a filler 260 disposed between the side surface of the display panel 200 and the connection unit 240.

Specifically, according to an embodiment, the filler 260 is disposed between the curved surface portion 242 of the connection unit 240 and the side surface of the display panel 200. For example, the filler 260 is disposed between the side surface of the first substrate 101 and the curved surface portion 242, as illustrated in FIG. 2.

According to an embodiment, the filler 260 includes a resin 261 and a heat dissipating material 262 dispersed in the resin 261. The resin 261 is a sticky material that can be rapidly cured by ultraviolet light (UV). As the resin 261 is formed on the curved surface portion 242 of the connection unit 240, an adhesive force between the display panel 200 and the connection unit 240 is improved. In addition, as the resin 261 is disposed on the curved surface portion 242 of the connection unit 240, an air gap which was present between the display panel 200 and the connection unit 240 is removed. Accordingly, attachment of the connection unit 240 to the display panel 200 is improved by the resin 261 of the filler 260, and the mechanical strength of the OLED display device 100 is improved. A heat dissipation material 262 dissipates heat generated in the driving chip 250 and the connection unit 240. The heat dissipation material 262 includes at least one of gold, silver, copper, tungsten, carbon nanotube (CNT), graphite, or a mixture thereof. The heat dissipation material 262 includes small particles of a material such as copper or graphite, etc. In addition, the heat dissipation material 262 can include a metal having high thermal conductivity.

In an embodiment, a plurality of wirings in the connection unit 240 that are connected to the pad electrode 280 are bent and connected to the printed circuit board 270 therebelow, in which case the wiring can be damaged.

Figure 3:
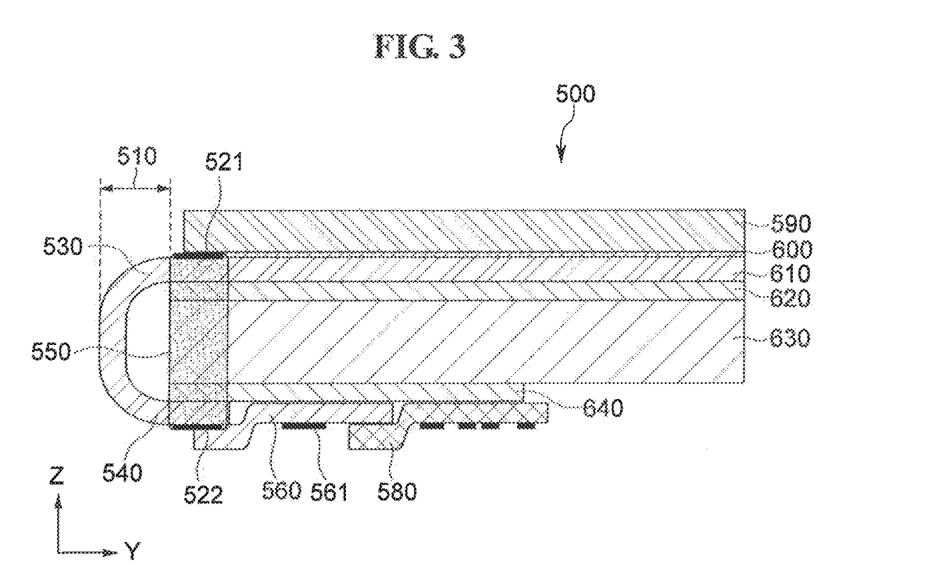
FIG. 3 illustrates a side surface portion of an OLED display device according to an embodiment of the present disclosure.

FIG. 3 illustrates a side surface portion of an OLED display device according to an embodiment of the present disclosure. Referring to FIG. 3, an OLED display device includes a flexible display substrate 610, a touch layer 600, a polarizer 590, a first adhesive layer 620, a second adhesive layer 640, a connection pad 550, a driving chip 561 mounted as a chip on film ("COF"), a printed circuit board 580, and a filler layer 630.

According to an embodiment, the touch layer 600 is disposed on the flexible display substrate 610, and the polarizer 590 is disposed on the touch layer 600. The flexible substrate 610 includes a bent portion 510 where the substrate is bent, and the bent portion 510 includes an upper bent portion 530 and a lower bent portion 540. A lower surface of the flexible substrate 610 is attached to the first adhesive layer 620 and the second adhesive layer 640, and the filler layer 630 is disposed between the first adhesive layer 620 and the second adhesive layer 640. A film 560 on which the driving chip 561 is mounted is attached to the second adhesive layer 640, and an upper portion of the printed circuit board 580 and a lower portion of the film 560 are electrically connected to each other at one end portion of the printed circuit board 580.

According to an embodiment, the connection pad 550 includes an upper pad area 521 connected to the flexible display substrate 610 and a lower pad area 522 connected to the film 560 that connects the flexible display substrate 610 and the driving chip 561. The upper pad area 521 includes a pad terminal, etc., and electrically connects the flexible display substrate 610 and the connection pad 550. The lower pad area 522 includes a pad terminal, etc., and electrically connects the film 560 and the flexible display substrate 610. The connection pad 550 is disposed on side surfaces of the flexible display substrate 610 and on opposite sides of the flexible display substrate 610. The connection pad 550 includes silver.

In addition, a display device according to an embodiment of the present disclosure further includes a connection pad disposed on one side surface of the display substrate 610 and that includes an upper pad area and a lower pad area, is connected to the touch layer 600 by the upper pad area 521, the display substrate 610 by the lower pad area 522, and overlaps the connection pad 550.

Figure 4:
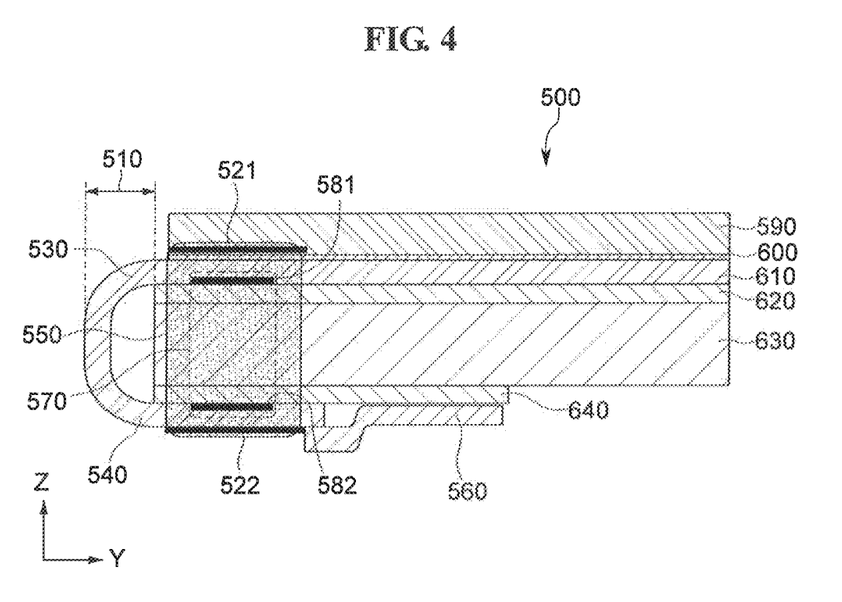
FIG. 4 illustrates a side surface portion of an OLED display device according to an embodiment of the present disclosure.

FIG. 4 illustrates a side surface portion of an OLED display device according to an embodiment of the present disclosure. Referring to FIG. 4, an OLED display device 500 includes a flexible display substrate 610, a touch layer 600, a polarizer 590, a first adhesive layer 620, a second adhesive layer 640, a connection pad 550, a filler layer 630, and a film 560 that includes a driving chip that drives the touch layer 600.

According to an embodiment, the touch layer 600 is disposed on the flexible display substrate 610, and the polarizer 590 is disposed on the touch layer 600. The flexible substrate 610 includes a bent portion 510 where the substrate is bent, and the bent portion 510 includes an upper bent portion 530 and a lower bent portion 540. A lower portion of the flexible substrate 610 is attached to the first adhesive layer 620 and the second adhesive layer 640, and the filler layer 630 is disposed between the first adhesive layer 620 and the second adhesive layer 640. One end portion of the film 560 that includes a driving chip for driving the touch layer 600 is attached to the second adhesive layer 640, and another end portion thereof is attached to the flexible display substrate 610.

According to an embodiment, the connection pad 550 includes an upper pad area 521 connected to the flexible display substrate 610, and a lower pad area 522 connected to the film 560. The upper pad area 521 includes a pad terminal, etc., and electrically connects the touch layer 600 and the connection pad 550. The lower pad area 522 includes a pad terminal, etc., and is electrically connected to the display substrate 610 at a lower portion of the substrate 610. The connection pad 550 is disposed on side surfaces of the flexible display substrate 610 and is disposed on opposite sides of the flexible display substrate 610.

In addition, according to an embodiment, the connection pad 550 includes silver. The connection pad 550 connects the wiring of the touch layer 600 to the flexible display substrate 610. Accordingly, damage to wirings connected to the touch layer 600 at the substrate bent portion 510 can be substantially prevented.

Referring to FIG. 4, according to an embodiment, a connection pad 570 overlaps the connection pad 550. The connection pad 570 is connected to the flexible display substrate 610 at an upper end 581 and a lower end 582 of the connection pad 570. In such an exemplary embodiment, an insulating layer is disposed between the connection pad 550 and the connection pad 570.

In an embodiment, the connection pads 570 are disposed adjacent to one side surface of the flexible display substrate 610 and does not overlap the connection pad 550.

Figure 5:
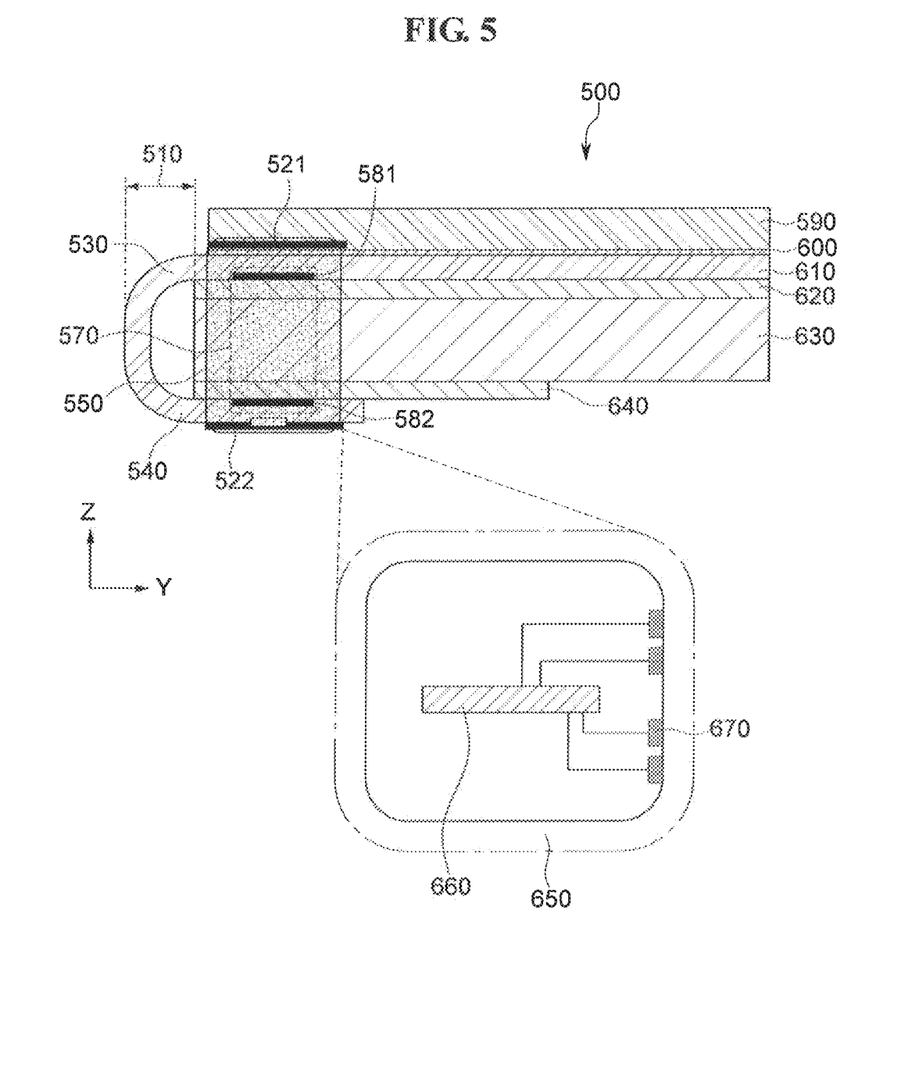
FIG. 5 illustrates a side surface portion of an OLED display device according to an embodiment of the present disclosure.

FIG. 5 illustrates a side surface portion of an OLED display device according to an embodiment of the present disclosure. Referring to FIG. 5, an OLED display device 500 includes a flexible display substrate 610, a touch layer 600, a polarizer 590, a first adhesive layer 620, a second adhesive layer 640, a connection pad 550, a touch layer driving unit 650 mounted as a chip on pad ("COP"), and a filler layer 630.

According to an embodiment, the touch layer 600 is disposed on the flexible display substrate 610, and the polarizer 590 is disposed on the touch layer 600. The flexible display substrate 610 includes a substrate bent portion 510, and the substrate bent portion 510 includes an upper substrate bent portion 530 and a lower substrate bent portion 540. A lower portion of the flexible substrate 610 is attached to the first adhesive layer 620 and the second adhesive layer 640, and the filler layer 630 is disposed between the first adhesive layer 620 and the second adhesive layer 640. The touch layer driving unit 650 includes a driving chip 660 that drives the touch layer 600 and is attached to a lower portion of the flexible display substrate 610. The connection pad 550 includes an upper pad area 521 connected to the touch layer 600 and a lower pad area 522 connected to a pad on which the driving chip 660 is mounted. The upper pad area 521 includes a pad terminal, etc., that electrically connects the touch layer 600 and the connection pad 550. The lower pad area 522 includes a pad terminal, etc., and is electrically connected to the touch layer driving unit 650. The touch layer driving unit 650 is attached to a lower portion of the display substrate 610, and is vertically connected to the connection pad 550. The touch layer driving unit 650 includes the driving chip 660 that drives the touch layer 600, and includes a contact portion 670 that is vertically connected to the connection pad 550.

According to an embodiment, the connection pad 550 is disposed on side surfaces of the flexible display substrate 610, and the connection pad 550 is disposed on opposite side surfaces of the flexible display substrate 610. In addition, the connection pad 550 includes silver.

According to an embodiment, the connection pad 550 connects the wiring of the touch layer 600 to the flexible display substrate 610 on the side surface thereof. Accordingly, wiring connected to the touch layer 600 can be removed from the substrate bent portion 510, and damage to the wiring connected to the touch layer 600 at the substrate bent portion 510 can be substantially prevented. In an embodiment, another connection pad 570 is attached inside the connection pad 550. The connection pad 570 is connected to the flexible display substrate 610 at an upper end 581 and a lower end 582. In such an exemplary embodiment, an insulating layer is disposed between the connection pad 550 and the connection pad 570. The connection pad 570 overlaps the connection pad 550.

In an embodiment, a printed circuit board connected to the touch layer driving unit 650 is further included.

Figure 6:
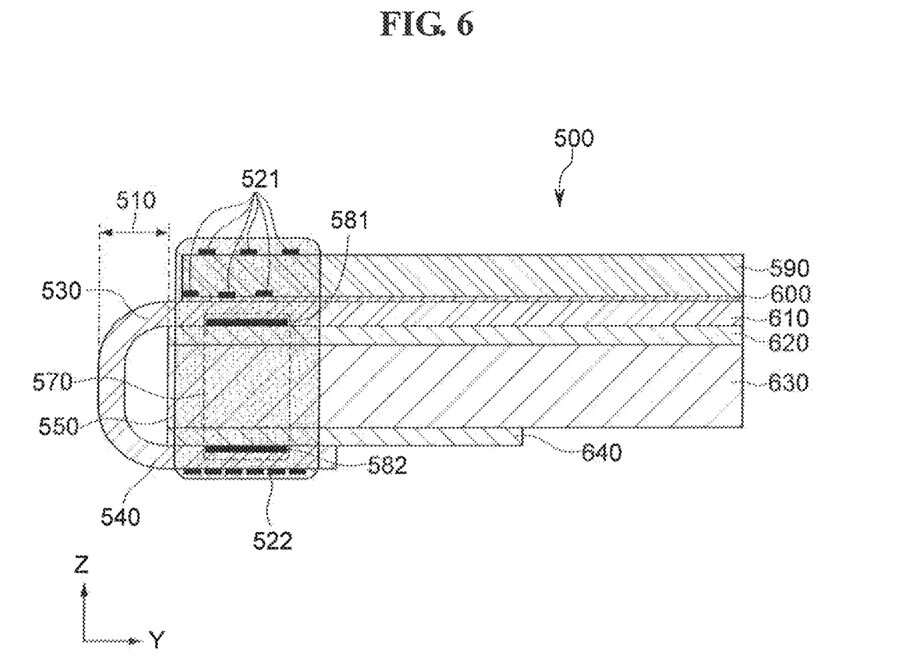
FIG. 6 illustrates a side surface portion of an OLED display device according to an embodiment of the present disclosure.

FIG. 6 illustrates a side surface portion of an OLED display device according to an embodiment of the present disclosure. Referring to FIG. 6, an OLED display device 500 includes a flexible display substrate 610, a touch layer 600, a polarizer 590, a first adhesive layer 620, a second adhesive layer 640, a connection pad 550, and a filler layer 630.

In an embodiment, the touch layer 600 is disposed on the flexible display substrate 610, and the polarizer 590 is disposed on the touch layer 600. The flexible substrate 610 includes a substrate bent portion 510, and the substrate bent portion 510 includes an upper substrate bent portion 530 and a lower substrate bent portion 540. A lower portion of the flexible substrate 610 is attached to the first adhesive layer 620 and the second adhesive layer 640, and the filler layer 630 is disposed between the first adhesive layer 620 and the second adhesive layer 640. The connection pad 550 includes an upper pad area 521 connected to the flexible display substrate 610, and a lower pad area 522 connected to the flexible display substrate 610. The upper pad area 521 and the lower pad area 522 include a pad terminal that electrically connects the touch layer 600 and the connection pad 550. The upper pad area 521 includes a two-layer terminal which contacts the touch layer 600 and transmits signals of the touch layer 600. The lower pad area 522 includes a pad terminal, etc., and is electrically connected to the flexible display substrate 610. The connection pad 550 are disposed on side surfaces of the flexible display substrate 610, and the connection pad 550 are disposed on opposite side surfaces of the flexible display substrate 610. In addition, the connection pad 550 includes silver.

In an embodiment, the connection pad 550 connects the wiring of the touch layer 600 to the flexible display substrate 610 on the side surface thereof. Accordingly, wiring connected to the touch layer 600 can be removed from the substrate bent portion 510, and thus damage to the wirings connected to the touch layer 600 at the substrate bent portion 510 can be substantially prevented. In an embodiment, another connection pad 570 is attached inside the connection pad 550. The connection pad 570 is connected to the flexible display substrate 610 at an upper end 581 and a lower end 582. In such an exemplary embodiment, an insulating layer is disposed between the connection pad 550 and the connection pad 570. The connection pad 570 overlaps the connection pad 550.

As set forth hereinabove, in a display device according to one or more exemplary embodiments, exposure and damage to wirings can be substantially prevented by disposing a connection pad on a side surface of a display device to connect substrates.

From the foregoing, it will be appreciated that exemplary embodiments in accordance with the present disclosure have been described herein for purposes of illustration, and that various modifications may be made without departing from the scope and spirit of the present teachings. Accordingly, the exemplary embodiments disclosed herein are not intended to be limiting of the true scope and spirit of the present teachings. Various features of the above described and other embodiments may be mixed and matched in any manner, to produce further embodiments consistent with the disclosure.

What is claimed is:

1. A display device, comprising:
    a display substrate that includes a first flat portion, a second flat portion overlapping the first flat portion and a bent portion between to the first flat portion and the second flat portion;
    a driving chip; and
    a first connection pad disposed on one side surface of the display substrate that connects the display substrate and the driving chip and that includes an upper pad area and a lower pad area,
    wherein the first connection pad is oriented in a plane that is perpendicular to a plane of a display surface of the display substrate,
    wherein the first connection pad is connected to the first flat portion and the second flat portion and spaced apart from the bent portion, and
    a major surface of the first connection pad is perpendicular to a major surface of the first flat portion, a major surface of the second flat portion and a major surface of the bent portion.

2. The display device of claim 1, wherein
    the upper pad area of the first connection pad is connected to the display substrate, and lower pad area of the first connection pad is connected to the driving chip.

3. The display device of claim 1, further comprising a printed circuit board connected to the driving chip.

4. The display device of claim 1, wherein the first connection pad includes silver.

5. The display device of claim 1, wherein the first connection pad is disposed on another side surface of the display substrate.

6. The display device of claim 1, further comprising:
a touch layer disposed on the display substrate; and
a second connection pad disposed on one side surface of the display substrate between the first connection pad and the display substrate and that includes an upper pad area and a lower pad area,
wherein the second connection pad is oriented in a plane that is perpendicular to the plane of the display surface of the display substrate, wherein
the upper pad area of the second connection pad is connected to the touch layer, and
the lower pad area of the second connection pad is connected to the display substrate.

7. The display device of claim 6, further comprising a touch layer driving unit connected to the display substrate by the lower pad area of the second connection pad.

8. The display device of claim 6, wherein the first connection pad overlaps the second connection pad.

9. A display device, comprising:
a display substrate that includes a first flat portion, a second flat portion overlapping the first flat portion and a bent portion between to the first flat portion and the second flat portion;
a touch layer disposed on the first flat portion of the display substrate;
a first connection pad disposed on at least one side surface of the display substrate and that includes an upper pad area and a lower pad area,
wherein the first connection pad is oriented in a plane that is perpendicular to a plane of a display surface of the display substrate,
wherein the upper pad area of the first connection pad is connected to the touch layer, and the lower pad area of the first connection pad is connected to the display substrate; and
a touch layer driving unit connected to the display substrate,
wherein the first connection pad is connected to the first flat portion and the second flat portion and spaced apart from the bent portion, and
a major surface of the first connection pad is perpendicular to a major surface of the first flat portion, a major surface of the second flat portion and a major surface of the bent portion.

10. The display device of claim 9, wherein the first connection pad includes silver.

11. The display device of claim 9, wherein
the upper pad area of the first connection pad is connected to the display substrate and
the lower pad area of the first connection pad is connected to the touch layer driving unit.

12. The display device of claim 9, further comprising a printed circuit board connected to the touch layer driving unit.

13. The display device of claim 9, wherein the first connection pad is disposed on another side surface of the display substrate.

14. The display device of claim 9, wherein the touch layer driving unit is connected to the display substrate by the lower pad area of the first connection pad.

15. A display device, comprising:
a display substrate that includes a first flat portion, a second flat portion overlapping the first flat portion and a bent portion between to the first flat portion aryl the second flat portion;
a touch layer disposed on an upper portion of the display substrate;
a touch layer driving unit disposed on a lower portion of the display substrate; and
a first connection pad disposed on at least one side surface of the display substrate and that includes an upper pad area and a lower pad area,
wherein the first connection pad is oriented in a plane that is perpendicular to a plane of a display surface of the display substrate,
wherein the upper pad area is connected to the touch layer and the lower pad area is connected to the touch layer driving unit,
the first connection pad is connected to the first flat portion and the second flat portion and spaced apart from the bent portion, and
a major surface of the first connection pad is perpendicular to a major surface of the first flat portion, a major surface of the second flat portion and a major surface of the bent portion.

16. The display device of claim 15, wherein the first connection pad includes silver.

17. The display device of claim 15, wherein the first connection pad is disposed on another side surface of the display substrate.

18. The display device of claim 15, further comprising a second connection pad disposed on one side surface of the display substrate between the first connection pad and the display substrate and that includes an upper pad area and a lower pad area,
wherein the second connection pad is oriented in a plane that is perpendicular to the plane of the display surface of the display substrate,
wherein the upper pad area is connected to the touch layer and
the lower pad area is connected to the display substrate.

19. A display device, comprising:
a display substrate that includes a first flat portion, a second flat portion overlapping the first flat portion and a bent portion between to the first flat portion and the second flat portion; and
a first connection pad disposed on a side surface of the display substrate and that includes an upper pad area and a lower pad area,
wherein the first connection pad is oriented in a plane that is perpendicular to a plane of a display surface of the display substrate,
wherein the upper pad area comprises a terminal which includes a first layer and a second layer, the terminal transmitting signals received from a touch layer,
the first connection pad is connected to the first flat portion and the second flat portion and spaced apart from the bent portion, and
a major surface of the first connection pad is perpendicular to a major surface of the first flat portion, a major surface of the second flat portion and a major surface of the bent portion.

20. The display device of claim 19, wherein the first connection pad is disposed on another side surface of the display substrate.

\* \* \* \* \*